(12) United States Patent
Chen

(10) Patent No.: US 8,847,320 B2
(45) Date of Patent: Sep. 30, 2014

(54) DECOUPLING CAPACITOR AND LAYOUT FOR THE CAPACITOR

(75) Inventor: Chung-Hui Chen, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 124 days.

(21) Appl. No.: 13/362,411

(22) Filed: Jan. 31, 2012

(65) Prior Publication Data

US 2013/0193499 A1     Aug. 1, 2013

(51) Int. Cl.
 *H01L 23/02*   (2006.01)
 *H01L 21/70*   (2006.01)
 *H01L 27/06*   (2006.01)
 *H01L 21/8222* (2006.01)

(52) U.S. Cl.
 USPC ........... 257/358; 257/359; 257/363; 257/380; 257/533; 438/330; 438/331; 438/332

(58) Field of Classification Search
 USPC ................. 257/296, 358–359, 363, 380, 533; 438/239, 330–332
 See application file for complete search history.

(56) References Cited

U.S. PATENT DOCUMENTS

| | | | |
|---|---|---|---|
| 6,849,909 B1* | 2/2005 | Nair et al. | 257/412 |
| 2002/0063291 A1* | 5/2002 | Brown et al. | 257/359 |
| 2005/0077562 A1* | 4/2005 | Divakaruni et al. | 257/298 |
| 2006/0073706 A1* | 4/2006 | Li et al. | 438/710 |
| 2010/0187586 A1* | 7/2010 | Pellela et al. | 257/300 |

* cited by examiner

*Primary Examiner* — Kevin Parendo
(74) *Attorney, Agent, or Firm* — Duane Morris LLP; Steven E. Koffs

(57) ABSTRACT

A device comprises a semiconductor substrate having first and second implant regions of a first dopant type. A gate insulating layer and a gate electrode are provided above a resistor region between the first and second implant regions. A first dielectric layer is on the first implant region. A contact structure is provided, including a first contact portion conductively contacting the gate electrode, at least part of the first contact portion directly on the gate electrode. A second contact portion directly contacts the first contact portion and is formed directly on the first dielectric layer. A third contact portion is formed on the second implant region.

20 Claims, 9 Drawing Sheets

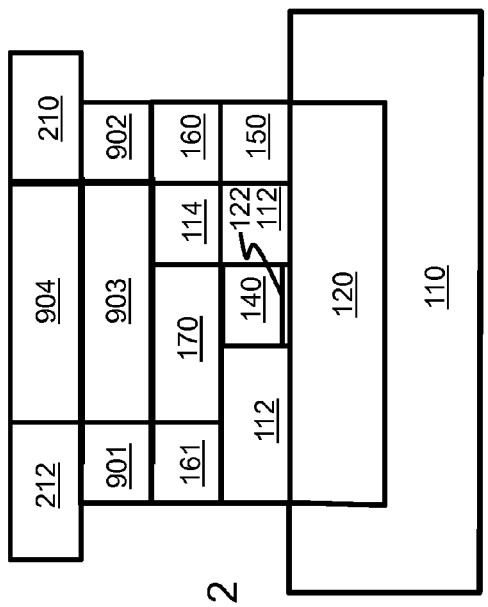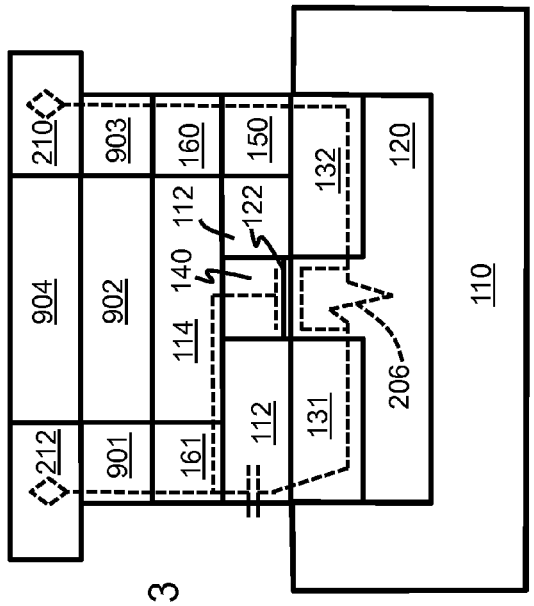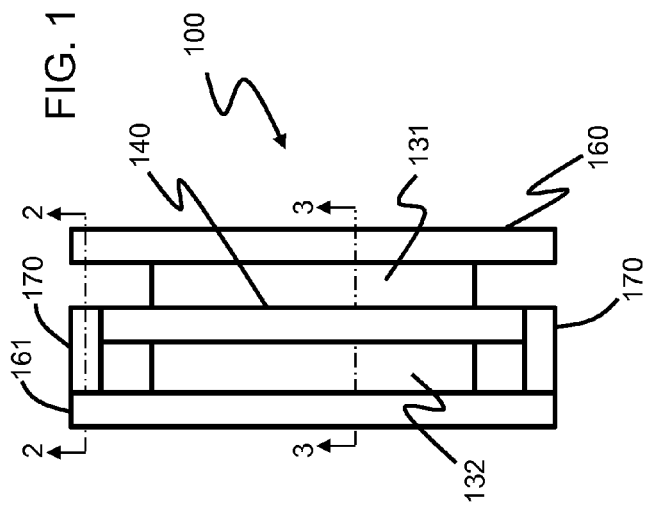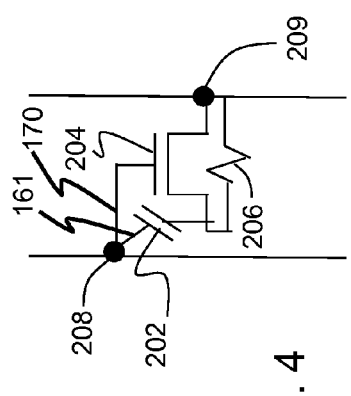

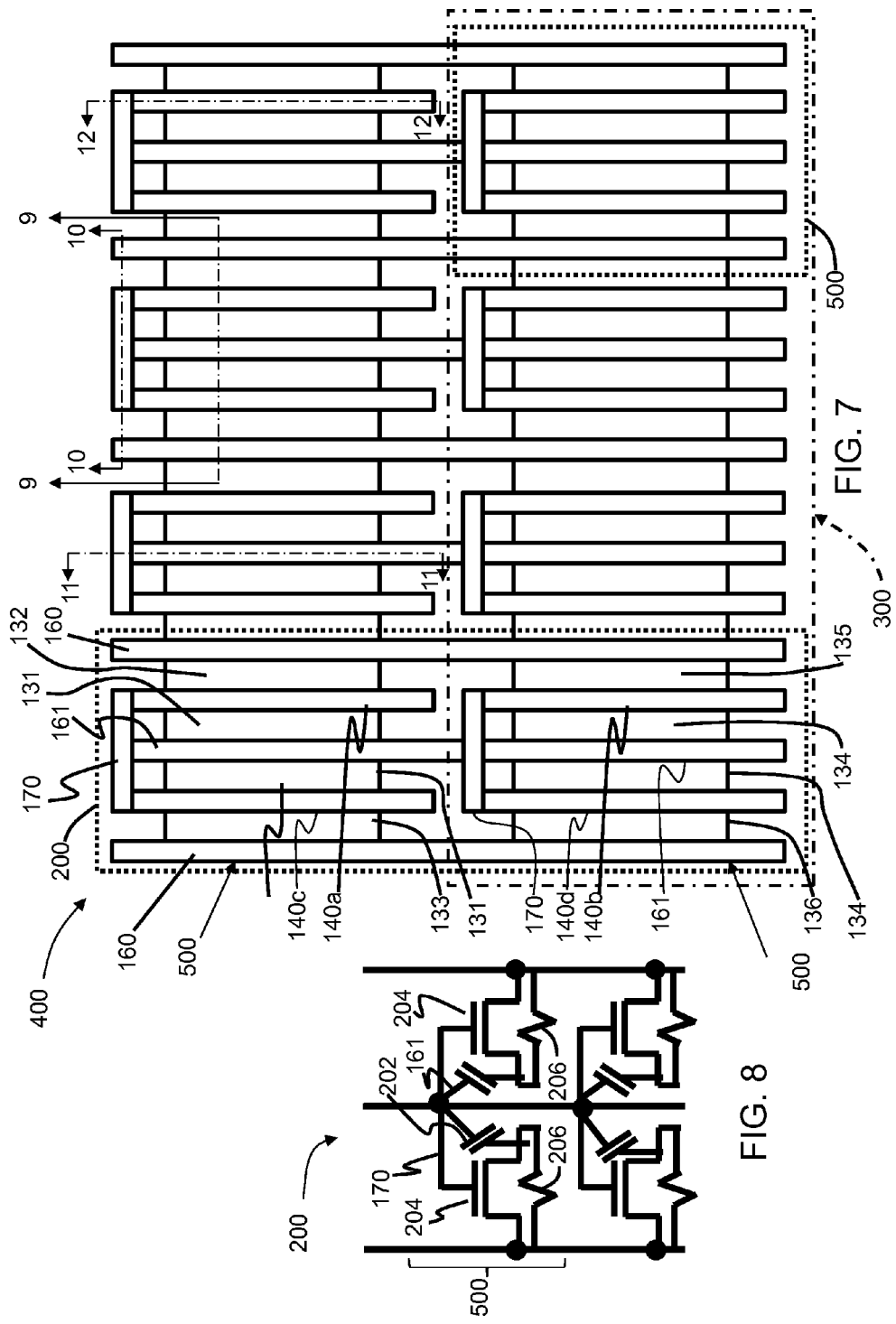

DECOUPLING CAPACITOR AND LAYOUT FOR THE CAPACITOR

FIELD

This disclosure relates to semiconductor integrated circuit devices and fabrication methods.

BACKGROUND

Power supply lines in a semiconductor integrated circuit (IC) supply current to charge and discharge active and passive devices in the IC. For example, digital complementary metal-oxide-semiconductor (CMOS) circuits draw current when the clock makes a transition. During the operation of circuits, the power supply lines supply transient currents with a relatively high intensity, which can result in voltage noise on the power supply lines. The voltage on the power supply line will fluctuate when the fluctuation time of the transient current is short or when its parasitic inductance or parasitic resistance is large.

The operational frequency of the IC may be on the order of several hundreds of mega-hertz (MHz) to several giga-hertz (GHz). In such circuits, the rising time of clock signals is very short, so that voltage fluctuations in the supply line may be very large. Undesired voltage fluctuations in the power supply line powering a circuit can cause noise on its internal signals and degrade noise margins. The degradation of noise margins can reduce circuit reliability or even cause circuit malfunction.

To reduce the magnitude of voltage fluctuations in the power supply lines, filtering or decoupling capacitors are usually used between the terminals of different power supply lines or between terminals of power supply line and the ground line. Decoupling capacitors act as charge reservoirs that additionally supply currents to circuits to prevent momentary drops in supply voltage.

BRIEF DESCRIPTION OF THE DRAWINGS

FIG. 1 is a plan view of a single decoupling capacitor cell.

FIG. 2 is a cross-sectional view taken along section line 2-2 of FIG. 1.

FIG. 3 is a cross sectional view taken along section line 3-3 of FIG. 1.

FIG. 4 is a schematic diagram of the capacitor cell of FIG. 1.

FIG. 5A is a plan view of a double cell having two of the decoupling capacitors of FIG. 1.

FIG. 5B is a schematic diagram of the device of FIG. 5A.

FIG. 6 is a cross-sectional view taken along section line 6-6 of FIG. 5.

FIG. 7 is a layout plan view of a two-dimensional array of decoupling capacitors.

FIG. 8 is a schematic diagram of one of the columns of FIG. 7.

DETAILED DESCRIPTION

Figure 9:
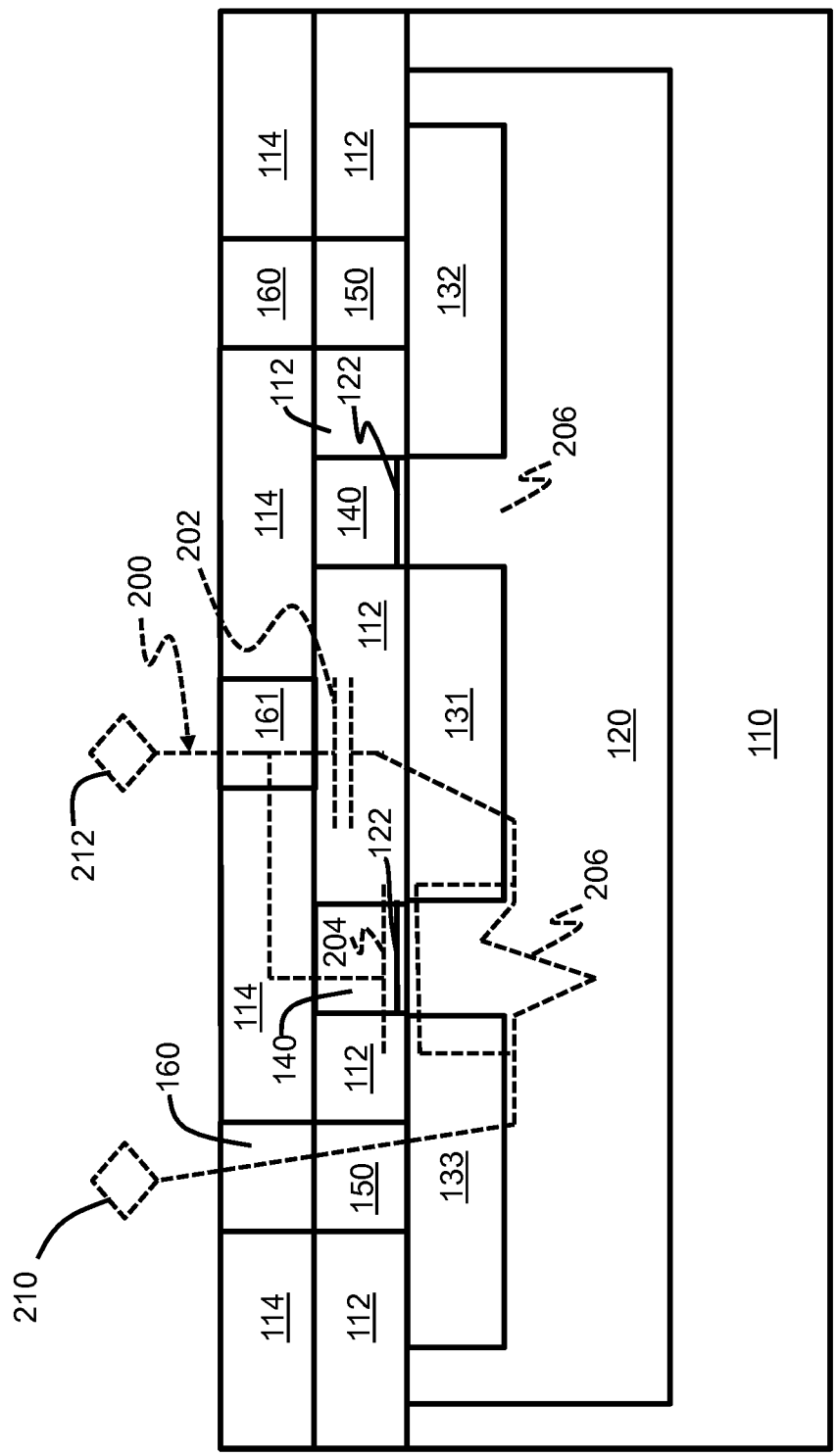
FIG. 9 is a cross-sectional view taken along section line 9-9 of FIG. 7.
Figure 10:
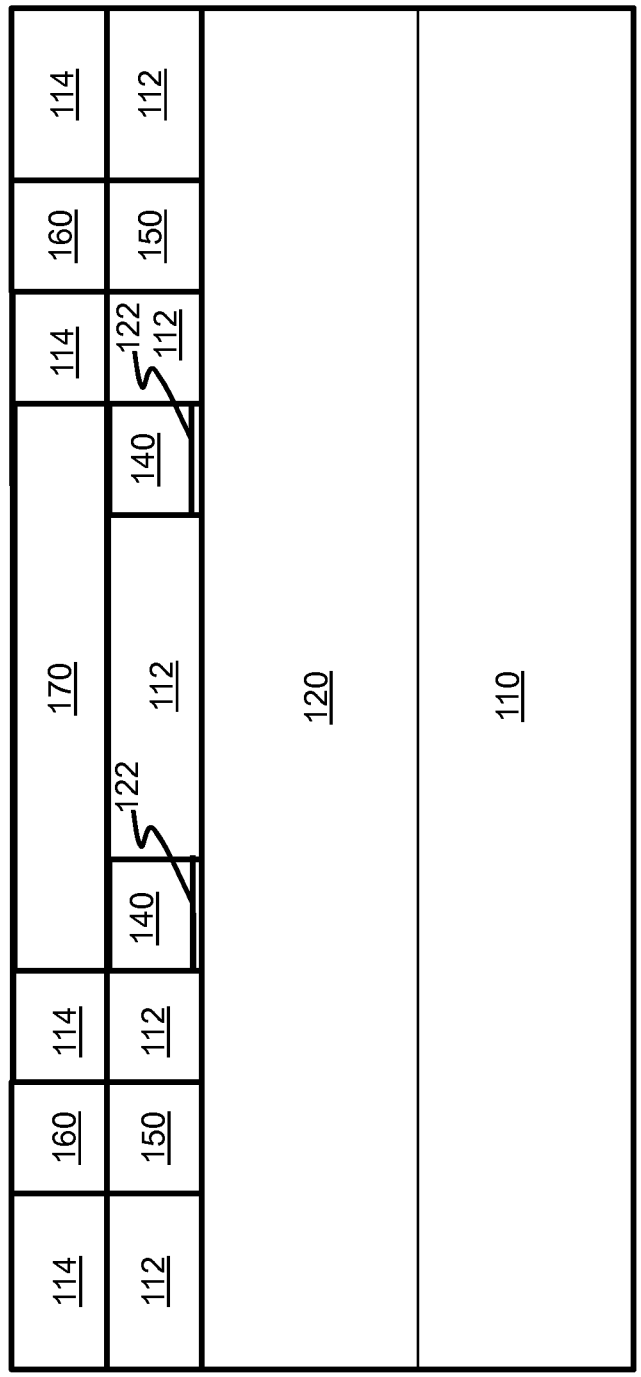
FIG. 10 is a cross-sectional view taken along section line 10-10 of FIG. 7.
Figure 11:
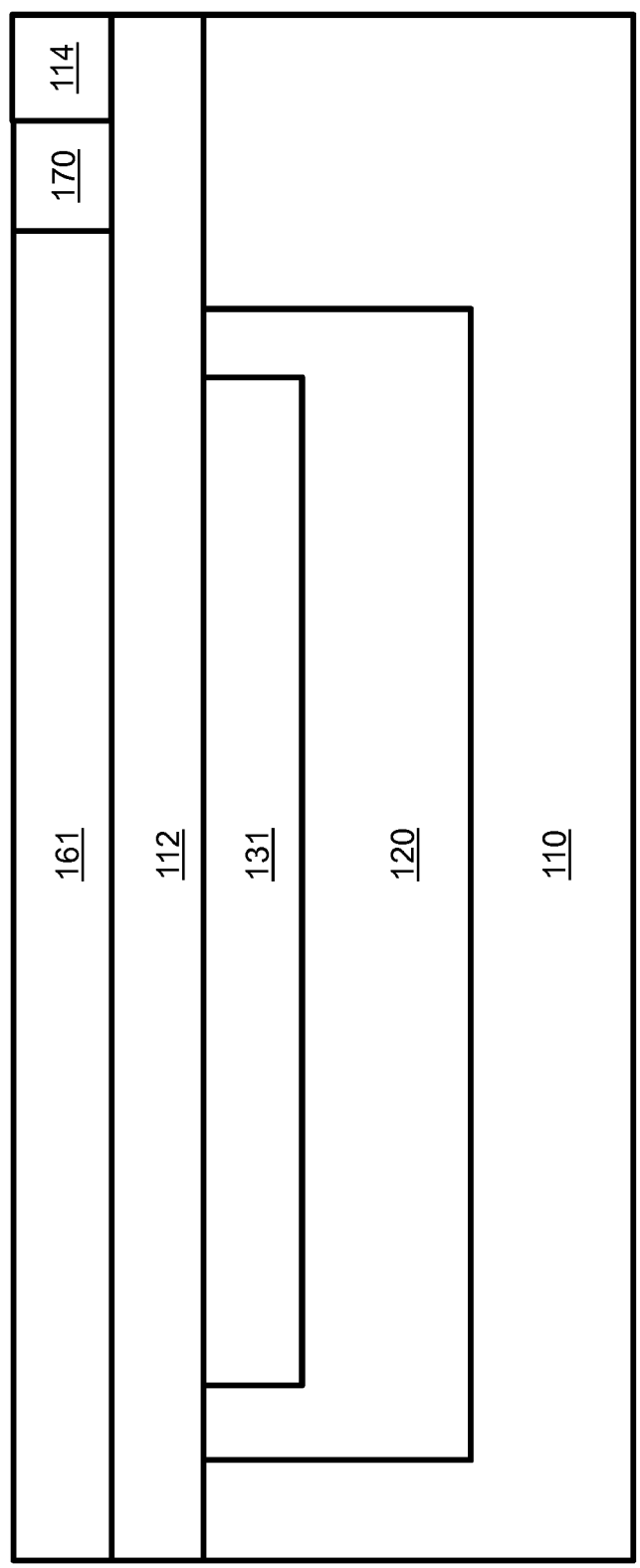
FIG. 11 is a cross-sectional view taken along section line 11-11 of FIG. 7.
Figure 12:
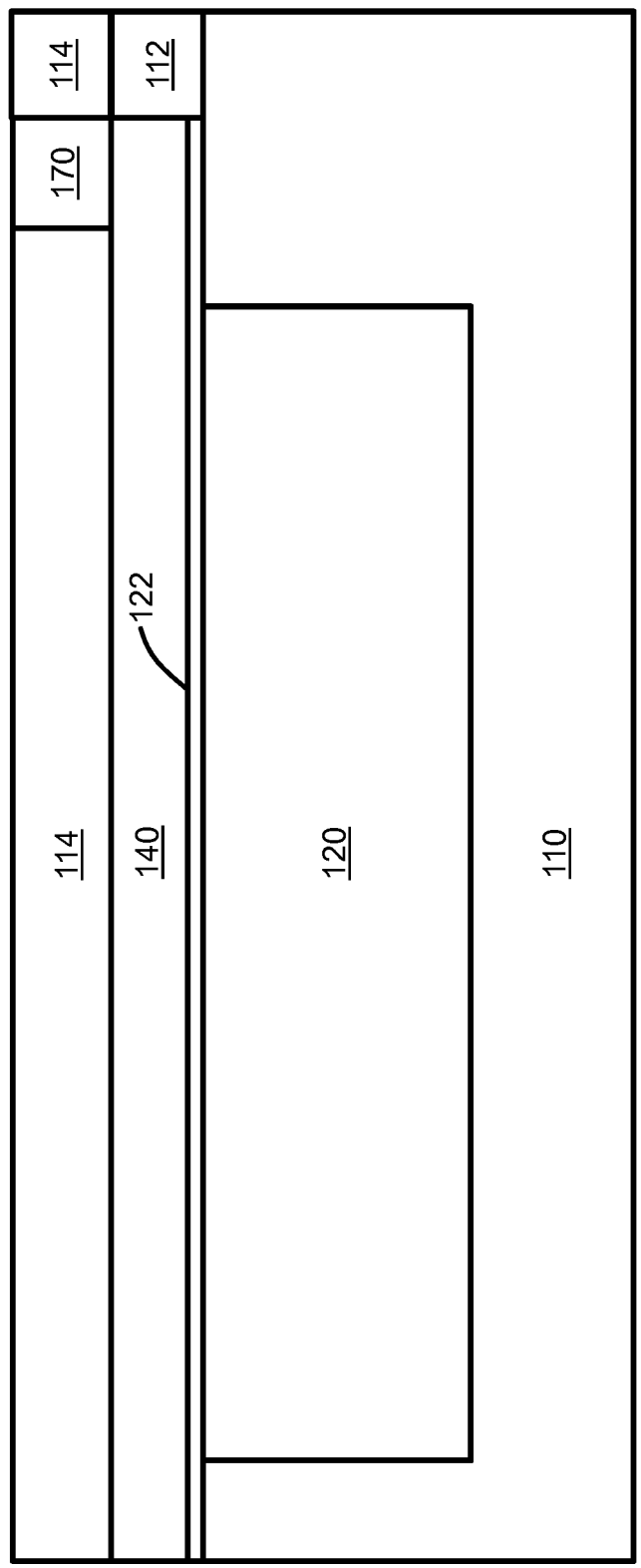
FIG. 12 is a cross-sectional view taken along section line 12-12 of FIG. 7.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

For advanced technologies, stricter design rules may be adopted to promote high yield. One design rule that is frequently employed is the use of a "poly-density" rule. "Poly-density" refers to the ratio of the area of gate electrode layer material to the total IC area. It has been determined that maintaining at least a minimum threshold poly-density across the IC helps prevent dishing and erosion in subsequently deposited interconnect layers.

Poly-density design rules are observed regardless of whether the gate electrode layer is formed of polycrystalline silicon or a high-k metal gate material. In the description below, unless expressly indicated to refer to semiconductor, references to "poly layer material" refers to any gate electrode layer material, regardless of whether polycrystalline silicon or metal.

In many cases, the area occupied by gate and/or capacitor electrodes in the gate electrode layer is relatively small compared to an area that meets the poly-density design rule. To meet the design rule, dummy poly layer fill material is inserted. The dummy poly layer fill is not required to be part of, or connected to, any of the active devices of the IC, and is not required to perform any logic function.

For advanced technologies (e.g., those having critical dimensions of 20 nm or smaller), slot contacts are also being considered. A slot contact is a contact having an elongated aspect ratio. For convenience, slot contact layers have the following abbreviations. M0 (metal 0) generally refers to a slot contact layer. M0_OD1 refers to an ohmic contact layer on an oxide definition doped impurity region. In some embodiments, the M0_OD1 layer is formed of copper or tungsten. M0_OD2 refers to a via or line pattern layer formed directly on the M0_OD1 layer. The M0_OD2 layer may include any combination of contact vias extending to the first metal layer and/or line patterns. In some embodiments, the M0_OD2 layer is formed of copper or tungsten. M0_PO refers to a slot contact layer formed directly on the gate electrode layer. In some embodiments, the M0_PO layer is formed of tungsten.

In some embodiments described below, the M0_OD1, M0_OD2, and M0_PO layers are used to build dummy patterns that are included in decoupling capacitors. Various configurations of decoupling capacitors can be used. Thus, conductive material in the M0 layer(s) performs a dual function: serving as dummy fill to improve the lithography process for subsequent layers, and to provide decoupling capacitors. By performing both of these functions with the same patterns, the IC area is used more efficiently, leaving more space open for functional circuitry, or permitting reduction in the total IC area. For example, in an IC having 15% dummy fill area and 40% decoupling capacitor poly density, the techniques described herein may reduce the total area occupied by dummy fill and decoupling capacitors by up to 12%. The structures described herein may be integrated into CMOS, NMOS or PMOS, or BiCMOS processes.

FIGS. 1-4 show a single cell of a decoupling capacitor. FIG. 2 is a cross-sectional view taken along section line 2-2, showing the gate contact or gate finger. FIG. 3 is a cross-sectional view taken along section line 3-3, showing the active area.

The capacitor 900 comprises a semiconductor substrate 110. Substrate 110 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, according to various exemplary embodiments.

Substrate 110 has a first implant region 131 and a second implant region 132 within in an impurity well 120. Implant regions 131 and 132 have the same dopant type. In the example, impurity well 120 is an N well, and implant regions 131 and 132 are both N+ implant regions.

A gate insulating layer 122 and a gate electrode 140 are formed above a resistor region 206, between the first and second implant regions 131, 132. In some embodiments, the insulating layer 122 is the same layer used for forming the gate insulating layer of transistors on the same substrate 110. In some embodiments, which do not use a high-k metal gate process, insulating layer 122 is a silicon oxide gate insulating layer. In other embodiments, the insulating layer 122 comprises a high-K dielectric, such as, but not limited to, a hafnium based oxide, a hafnium based oxynitride, or a hafnium-silicon oxynitride, hafnium silicate, zirconium silicate, hafnium dioxide and zirconium dioxide. The high-k dielectric layer 107 may include a binary or ternary high-k film such as HfO, LaO, AlO, ZrO, TiO, $Ta_2O_5$, $Y_2O_3$, STO, BTO, BaZrO, HfZrO, HfLaO, HfTaO, HfTiO, combinations thereof, or other suitable materials. Alternatively, the high-k dielectric layer 107 may optionally include a silicate such as HfSiO, LaSiO, AlSiO, combinations thereof. The insulating layer 122 may be deposited using atomic layer deposition.

The gate electrode 140 is formed in the same layer as the gate electrode of transistors formed in functional circuitry on the same IC. In some embodiments, which do not use a high-k metal gate process, the gate electrode 140 may be polycrystalline silicon. In embodiments which use a high-k metal gate process, the gate electrode 140 is a metal or alloy, such as but not limited to, titanium nitride, tantalum nitride, or aluminum nitride.

A first dielectric layer 112 is formed on the surface of the substrate 110. The first dielectric layer 112 may be silicon nitride, silicon oxide, silicon dioxide, silicon oxynitride, low-k dielectric, or ELK material. In some embodiments, the first dielectric layer 112 is the same dielectric material formed over the active devices in front end of line (FEOL) processing.

The first dielectric layer 112 is patterned to form a contact via for forming the M0_OD1 (bottom contact) layer 150 on the second implant region 132. The bottom contact portion 150 is formed in the M0_OD1 contact layer making ohmic contact with the second implant region 132. [0032] In some embodiments, the contacts 150 in the M0_OD1 layer are sputtered or evaporated metal pad patterned using photolithography, to provide low-resistance, and stability for the performance and reliability. For a silicon substrate, examples of suitable contact materials for contact portion 121 include W, Al, Al—Si, $TiSi_2$, TiN, $MoSi_2$, PtSi, $CoSi_2$, $WSi_2$. In some embodiments, the M0_OD2 layer 150 is made of the same material as the M0_OD1 layer 150. In one embodiment, the M0_OD1 layer is made of tungsten, the M0_OD2 layer is made of copper, and the M0 PO layer is made of tungsten.

In some embodiments, the contact 150 is an elongated slot contact, extending the entire width (i.e., the vertical dimension in FIG. 1) of the implant region 132. In other embodiments, the contact 150 has a length that is greater than the width of contact 150. For small geometries, the elongated slot contact provides a greater cross-sectional area and thus a smaller resistance than a square or round contact. In other embodiments, the bottom contact layer 150 comprises a plurality of square or round contact vias. The portion of the first dielectric layer 112 on the first implant region 130 remains intact.

The first dielectric layer 112 (including the gate electrode pattern 140 and bottom contact layer 150 may be planarized, so the first dielectric layer 112 has a height substantially the same as the height of a top surface of the gate electrode 140. Then a second dielectric layer 114 is formed over the first dielectric layer. In some embodiments, the second dielectric layer 114 is formed of the same material as the first dielectric layer 112. As shown in FIGS. 2 and 3, second dielectric layer 114 is provided on the first dielectric layer 112 and on a portion of the gate electrode 140 not covered by the gate (first) contact portion 770, such that the first, second and third contact portions 170, 161, 160 have a same height as the second dielectric layer 114

The second dielectric layer is patterned to form trenches for the patterns of the M0_OD2 layer and M0_PO layer. In some embodiments, the trenches for M0_OD2 layer patterns are formed and then filled with conductive material, and the trenches for M0_PO layer patterns are formed separately and then filled with material. In other embodiments, the trenches for the M0_OD2 layer and M0_PO layer patterns are formed at the same time, and a photoresist plug is used to fill one set of patterns while the other is being filled with conductive material. Then the photoresist plug is removed and the other set of patterns is filled with conductive material (thus allowing optional use of two different conductive materials for the M0_OD2 layer and M0_PO layer patterns). In other embodiments, the M0_OD2 and M0_PO patterns are all made of a single conductive material capable of forming an ohmic contact with the surface of the gate electrode 140.

FIG. 1 is a plan view showing the top surface of the gate electrode 140, along with a contact structure including the top contact layer patterns 160, 161 and 170. The gate contact 170 (first contact portion or gate finger) conductively contacts the gate electrode 140, as best seen in FIG. 2. At least part of the gate contact portion 170 is formed directly on the gate electrode 140. The gate contact portion extends to abut the second contact portion. In some embodiments, as shown in FIG. 1, a respective gate contact portion 170 is located at both top and bottom ends of the gate electrode 140. In other embodiments, a single gate contact 170 is located on either the top or the bottom end of gate electrode 140.

The contact structure has an elongated capacitor contact 161 ("second contact portion") overlying and extending beyond the first implant region 131. The capacitor electrode 161 is formed directly on the first dielectric layer 112, so that a capacitor is formed by capacitor electrode 161, dielectric 112, and implant region 131. The capacitor contact portion 161 abuts and directly contacts the gate contact portion 170.

The contact structure 900 has an elongated source contact 160 (third contact portion) overlying and extending beyond the second implant region 132. The top portion 160 of the source contact is formed directly on the bottom portion 150, which is in the bottom (M0_OD1) contact layer. In some embodiments, the top layer 160 of the source contact and the capacitor contact 161 are formed of the same conductive material in the same process step, as part of the same M0_OD2 layer.

Also shown in FIGS. 2 and 3 are the remaining major FEOL layers of the IC, that are deposited above the M0_OD2 layer. For ease of viewing, these layers are not shown in FIG. 1. An intermetal dielectric (IMD) layer, which may include (the Via 0, or V0, layer) 902 and the first (or M1) layer 904 is deposited over the M0_OD2 layer. In some embodiments, the vias 901 and 903 are formed, extending through the V0 layer, to connect to the source contact 160 and the capacitor contact 161 in the M0_OD2 layer. Then the trenches for conductive line patterns 212 and 210 are formed over the respective vias 901 and 903, completing the FEOL processing layers. The trenches 212, 210 and vias 901, 903 are filled with a conductive material. In other embodiments, the trenches are patterned first, and then the vias are patterned.

The capacitor contact 161 and source contact 160 are dummy fill patterns unconnected to the functional circuit of the IC, such that a total area of the functional circuit gate electrode layer patterns 1303 (shown in FIG. 13), the gate electrode 140, the capacitor contact 161, the source contact 160, and the gate contact 170 satisfy a minimum (poly) density design rule for the IC. That is, a ratio of the total area of polygons 1303, 140, 160, 161 and 170 to the total area of the IC satisfies the poly density rule.

In the example, the gate electrode 140 and gate contact 170 of the decoupling capacitor cell 900 do not have any direct external contact. The gate electrode 140 is tied to the capacitor contact 161 by way of the gate contact 170. 11.

Thus, in an interconnect structure having an intermetal dielectric layer 903 and at least one conductive line layer 904 having conductive patterns for connecting ones of the active devices of the functional circuitry, the contact portions 160 and 161 are directly connected to ones of the conductive patterns 210, 212 of the conductive line layer. But the gate electrode 140 is only connected to the conductive patterns 212 indirectly by way of the first contact portion 170 and the second contact portion 161.

FIG. 4 is a schematic diagram of the decoupling capacitor cell 900 of FIGS. 1-3. Also, in FIG. 3, the schematic is shown in dashed lines, superimposed on the corresponding structures of the device 900. The device 900 includes a capacitor 202 (corresponding to source contact 161, dielectric 112 and N+ implant region 131. The nodes 208 and 209 are connected to sources of high and low voltage potential, respectively.

In the example of FIG. 1, the active device 204 may be an N MOSFET or an N-varactor. For the N-varactor, N+ implants 131, 132 are formed in an N-well 120 as described above. For an NMOS embodiment, the N-well 120 is omitted, and the N+ implant regions 131 and 132 are formed directly in the surface of a P-type substrate 110.

The transistor 204 has a resistance 206 across the N-well, in series with the capacitor 202. When the voltage $V_{GS}$ between the gate 140 and the source (implant region 132) exceeds the threshold voltage Vth, a conductive channel is formed from the drain to the source, and current flows between capacitor contact 161 and source contact 160.

Figures 5A, 5B, 6:
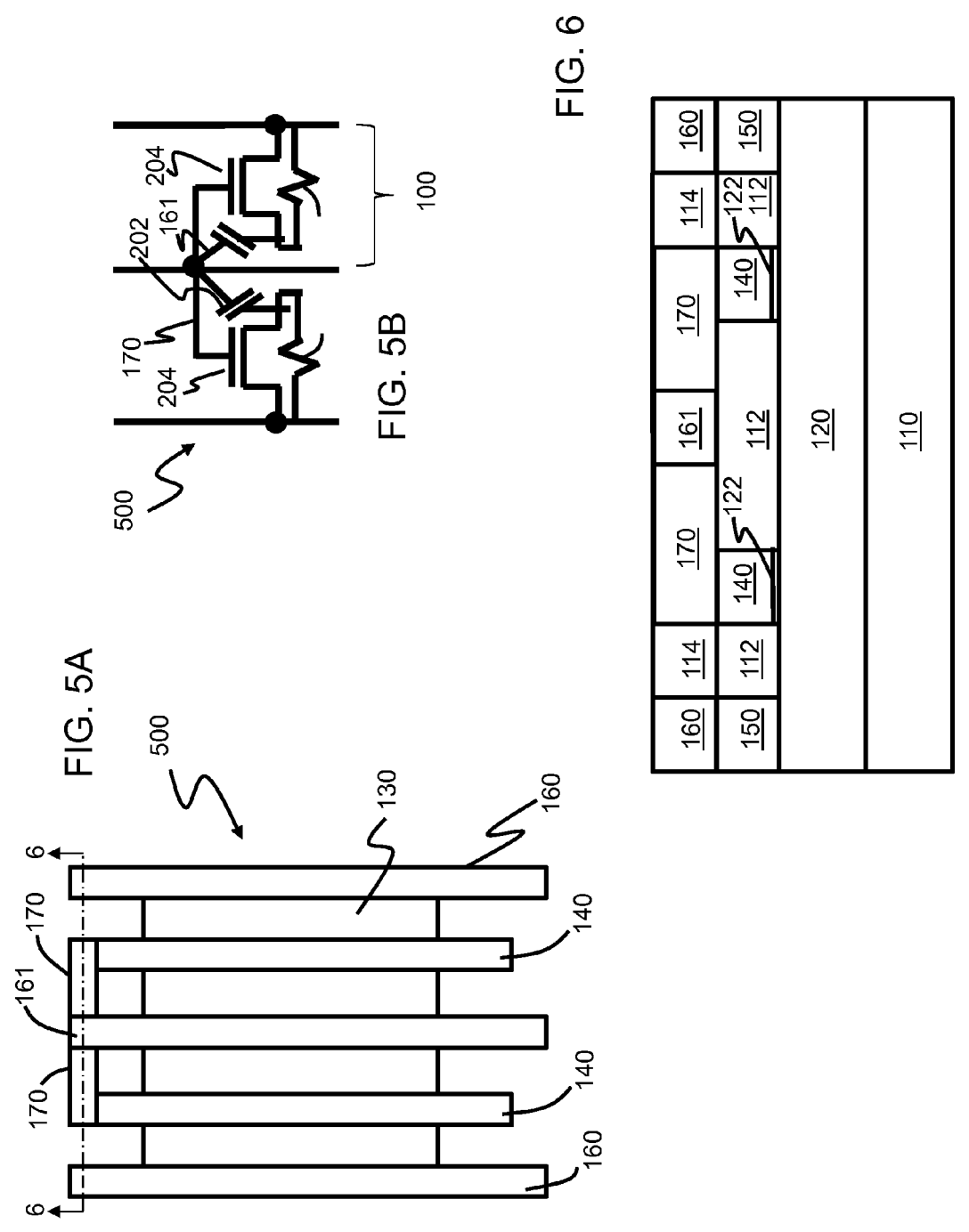

FIGS. 5A, 5B and 6 show a double cell configuration 500 including two of the cells 900 of FIG. 1, arranged symmetrically about a common capacitor contact 161. Like structures are indicated by like reference numerals. FIG. 6 is a cross sectional view of the gate contact structure 170 taken across section line 6-6 in FIG. 5A. The V0 and M1 layers are not shown in FIG. 6. One of ordinary skill will readily see that the structures from capacitor contact 161 to the right edge of FIG. 6 are identical to the corresponding structures in FIG. 2, and the same process and materials are used to make the double cell 500 of FIG. 5A. For brevity, a description of these structures is not repeated. FIG. 5B is a schematic diagram of the circuit of FIG. 5A. The double cell includes two decoupling capacitors connected in parallel, with their capacitor electrodes 161 and the gate electrodes 140 tied together. Additional details of the double cell configuration are described below with reference to FIGS. 7-12.

FIGS. 7-12 show an arrangement of the decoupling capacitors in an array having plural rows and plural columns. As shown by the dashed box 200, two or more of the double capacitor cells 500 of FIG. 5A may be arranged in a column 200. As shown by the dashed box 300, two or more of the double capacitor cells 500 of FIG. 5A may be arranged in a row 300. Thus, in various embodiments, the decoupling capacitor may be provided in an M×N array 400, where M is any positive integer and N is any positive integer. Thus, the array 400 having two rows 300, where each row has four of the double decoupling capacitor cells 500 is just one example, and is not limiting.

In some embodiments, one or more of the gate contacts 170 optionally crosses over the common capacitor electrode 161. As best seen in the cross-sectional view of FIGS. 10 and 12, a single gate contact 170 is formed over both gate electrodes 140a, 140c. As best seen in the cross-sectional view of FIG. 11, the gate contact 170 abuts the capacitor contact 160 at a single interface. The designer can optionally incorporate a single gate contact 170 abutting the end of capacitor contact 160 as shown in FIG. 7, or two gate contacts 170 abutting opposite sides of the capacitor contact 160 as shown in FIG. 5A.

As shown in FIG. 9, the double cell configurations of FIGS. 5 and 7 further comprise a third implant region 133 of the first dopant type in the impurity well 120. The first, second and third implant regions 131, 132, and 133 are aligned in the same row as each other. The first implant region 131 is common to the capacitors 202 of both the left and right decoupling capacitor cells.

A second gate electrode 140c is provided above a second resistor region 206 between the first implant region 131 and third implant region 133. The first contact 170 has an additional portion conductively contacting the second gate electrode 140c. In some embodiments, the additional portion of contact 170 extends is continuous with the portion contacting the first gate electrode 140a, as shown in FIG. 7. In other embodiments the additional portion 170 abuts an opposite side of the capacitor contact 161, as shown in FIG. 5A. The contact structure further comprises a second source electrode 160 (fourth contact portion) formed on the third implant region 133.

As shown in FIG. 7, the length of the contacts 160, 161 and 170 may be adapted for multiple-row configurations.

The bottom row 300 of double capacitor cells includes implant regions 134-136 of the first dopant type. Implant regions 131-133 are aligned in a first (top) row, and implant regions 134-136 are aligned in a second row. An additional gate electrode 140b is formed above a second resistor region 206 between the third implant region 134 and fourth implant region 135.

An additional gate contact 170 (fourth contact portion) is provided, connecting the gate electrodes 140b, 140d of the bottom double capacitor cell 500. At least part of the additional gate contact 170 (fourth contact portion) is formed directly on the gate electrodes 140b, 140d. The additional gate contact 170 conductively contacts the capacitor contact 161 of the top double capacitor cell 500 and also contacts an additional capacitor contact 161 formed above the implant region 134. As shown in FIG. 8, this ties the top electrodes of the respective capacitors 202 together. A portion of the first dielectric layer 112 is formed between the implant region 134 and the additional capacitor contact 161. In some embodiments, the source contact 160 may be extended in the vertical direction across two or more rows. In FIG. 7, the source contact 160 (third contact portion) extends over and contacts the implant region 135. As shown in FIG. 8, this ties the sources of the respective transistors 204 together.

Also, as shown in FIG. 7, the configuration extends horizontally as well as vertically. Thus, an additional gate electrode 140c is provided above a third resistor region 206 between the implant regions 131 and 133. The first contact portion 170 has an additional portion conductively contacting the third gate electrode 140c, and an extended source contact portion 160 is formed on the implant region 133 and extending over the implant region 136.

Thus, when plural devices are connected in columnar configurations, the source contacts 160 extend from the top row to the bottom row. In some embodiments, the capacitor contacts 161 and gate contacts 170 combine to form a continuous conductor extending from the top row to the bottom row. In other embodiments, using the two-part gate contact configuration 170 as shown in FIG. 5, a single capacitor contact 161 can extend from the top row of decoupling capacitors to the bottom row of decoupling capacitors, similar to the extended source contact 160.

Figure 13:
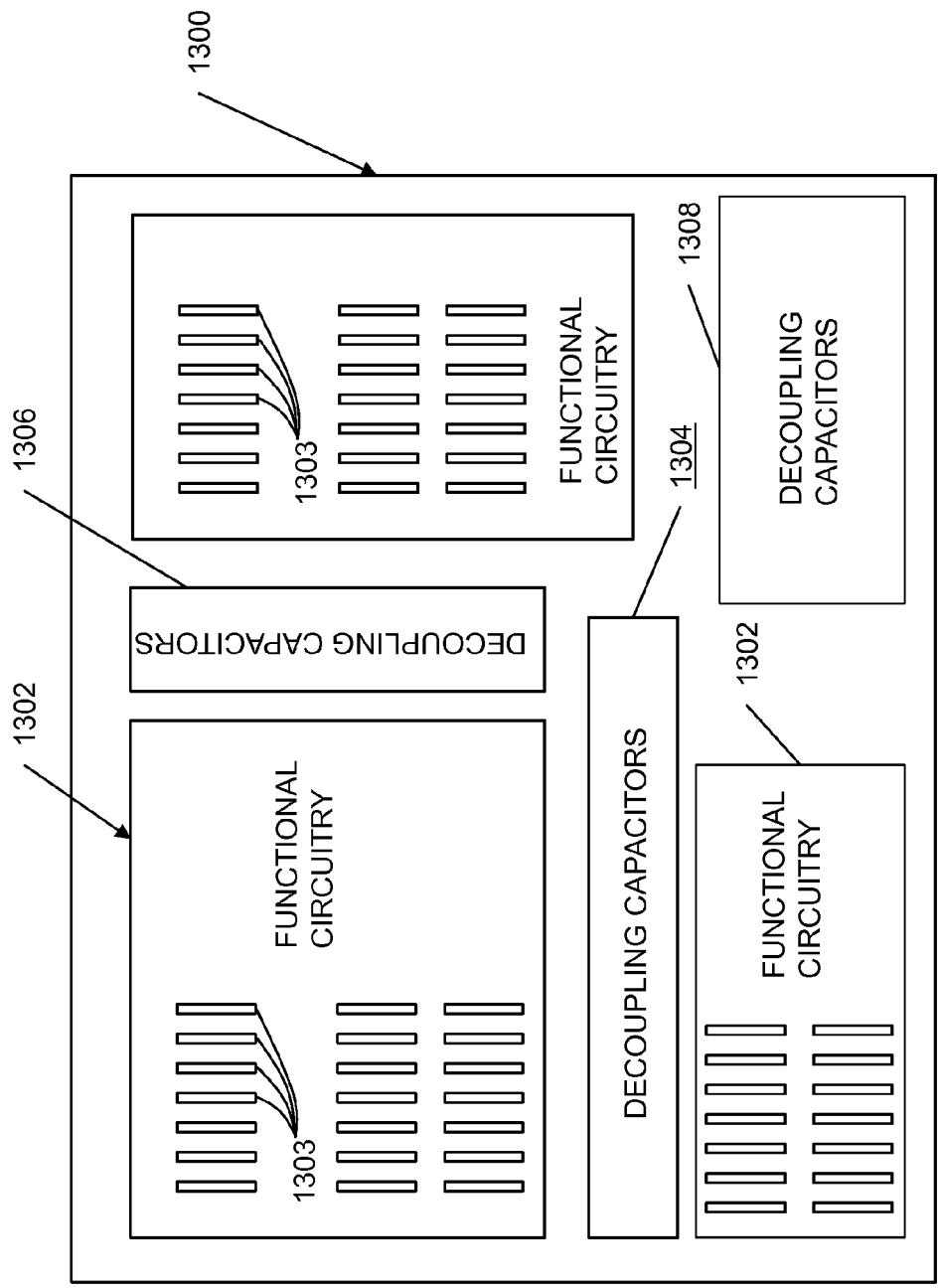
FIG. 13 is a floor plan of a portion of an integrated circuit having the decoupling capacitor.

FIG. 13 is a diagram of a plan view of the IC 1300. The IC has one or more functional circuits 1302, which include a plurality of active devices having gate electrodes 1303 in the gate electrode layer, and optionally, dummy fill patterns in the same layer. The decoupling capacitors described herein may be included in available space in one or more rows 1304 and/or one or more columns 1306. The decoupling capacitors may include one or more two-dimensional arrays 1308 of capacitors, as shown in FIG. 7. The functional circuitry areas 1302 may be contiguous or non-contiguous. The decoupling capacitor arrays 1304, 1306, 1308 may be contiguous or non-contiguous.

Figure 14:
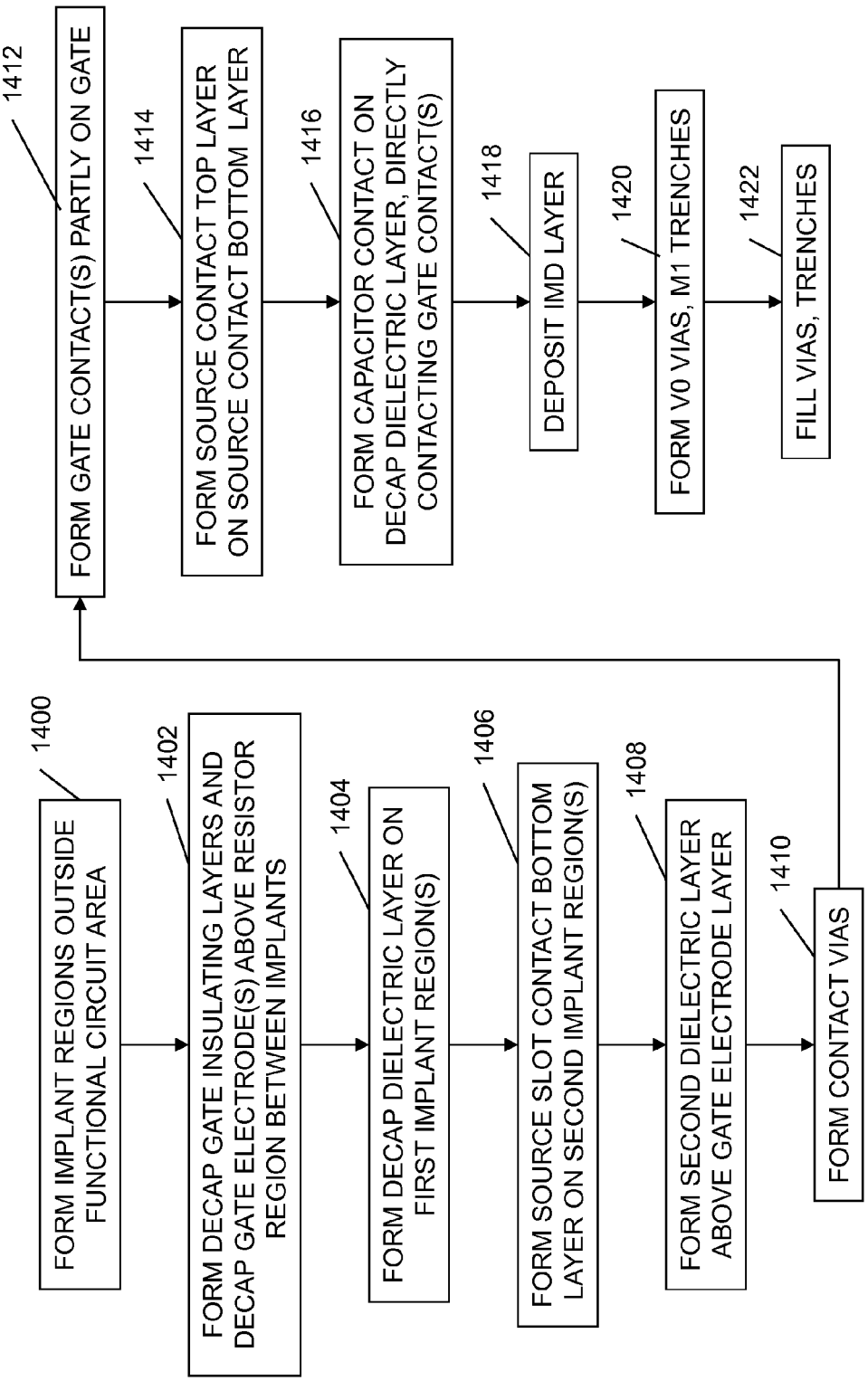
FIG. 14 is a flow chart of a method of making the decoupling capacitor.

FIG. 14 is a flow chart of an exemplary method for making the decoupling capacitors (decaps):

At step 1400, decap implant regions 131-133 of a first dopant type are formed in the surface of the semiconductor substrate outside of the functional circuit area. This step is performed at the same time the implant regions of the functional circuitry are formed.

At step 1402, a decap gate insulating layer 122 and a decap gate electrode 140 are formed above a resistor region between the decap implant regions. These steps are performed at the same time the gate insulating layer and gate electrode layer of the functional circuitry are formed.

At step 1404 a decap dielectric layer 112 is formed on the first implant region (or regions for multiple decaps).

At step 1406, a source slot contact is formed on the second implant region (or regions for multiple decaps). This step is performed at the same time the M0_OD1 contact layer patterns (if any) are formed for the functional circuits.

At step 1408, a second dielectric layer 114 is formed above the gate electrode layer.

At step 1410, the contact vias for the gate contact 170, capacitor contact 161 and the top of the source contact 160 are formed in the second dielectric layer 114. This step is performed at the same time the M0_OD2 contact layer vias (if any) are patterned for the functional circuits.

At step 1412, a gate contact 170 is formed by filling the gate contact via with conductive material (e.g., tungsten), conductively contacting the gate electrode, with at least part of the gate contact portion directly on the gate electrode. This step is performed at the same time the M0_PO patterns (if any) are formed on the gate electrodes of the functional circuits.

At step 1414, the source contact top layer is formed on the source contact bottom layer, by filling the top of the source contact via with conductive material (e.g., copper). This step is performed at the same time the M0_OD2 contact layer vias (if any) are filled.

At step 1416, a capacitor contact is formed on the first dielectric layer directly above the first implant region, by filling the capacitor contact via with a conductive material (e.g., copper). The capacitor contact directly contacts the gate contact.

At step 1418, the first IMD layer 903, 904 is formed over the substrate.

At step 1420, the V0 vias and M1 trenches are patterned in the first IMD layer.

At step 1422, the V1 vias and M1 trenches are filled, completing the FEOL layers.

In some embodiments, a device comprises a semiconductor substrate having first and second implant regions of a first dopant type. A gate insulating layer and a gate electrode are provided above a resistor region between the first and second implant regions. A first dielectric layer is on the first implant region. A contact structure is provided, including a first contact portion conductively contacting the gate electrode, at least part of the first contact portion directly on the gate electrode. A second contact portion directly contacts the first contact portion and is formed directly on the first dielectric layer. A third contact portion is formed on the second implant region.

In some embodiments, an integrated circuit (IC) comprises a semiconductor substrate having at least one circuit including a plurality of active devices. The active devices have a gate electrode layer. A decoupling capacitor comprises first and second implant regions of a first dopant type in the substrate. A gate insulating layer is above a resistor region between the first and second implant regions, and a gate electrode is formed in the gate electrode layer on the gate insulating layer. A first dielectric layer is on the first implant region. A contact structure includes a first contact portion conductively contacting the gate electrode, at least part of the first contact portion directly on the gate electrode. A second contact portion directly contacts the first contact portion and is formed directly on the first dielectric layer above the first implant region. A third contact portion is formed on the second implant region.

In some embodiments a method comprises: (a) forming first and second implant regions of a first dopant type in a surface of a semiconductor substrate outside a functional device region that is to contain a plurality of active devices; (b) providing a gate insulating layer and a gate electrode above a resistor region between the first and second implant regions; (c) providing a first dielectric layer on the first implant region; (d) forming a source contact on the second implant region; (e) forming a gate contact conductively contacting the gate electrode, at least part of the gate contact portion directly on the gate electrode; and (f) forming a capacitor contact on the first dielectric layer directly above the first implant region, the capacitor contact directly contacting the gate contact.

Although the subject matter has been described in terms of exemplary embodiments, it is not limited thereto. Rather, the appended claims should be construed broadly, to include other variants and embodiments, which may be made by those skilled in the art.

What is claimed is:

1. A device, comprising:
   a semiconductor substrate having first and second implant regions of a first dopant type;
   a gate insulating layer and a gate electrode above a resistor region, the resistor region being a portion of the substrate between the first and second implant regions;
   a first dielectric layer on the first implant region, the first dielectric layer having a top surface at a height substantially the same as a height of a top surface of the gate electrode; and
   a contact structure, including:
      a first contact portion conductively contacting the gate electrode, at least part of the first contact portion directly on the gate electrode,
      a second contact portion directly contacting the first contact portion and having an entire bottom surface thereof formed directly on dielectric material of the first dielectric layer, the bottom surface at substantially the same height as the top surface of the gate electrode, the second contact portion directly overlying the first implant region without a conductive connection therebetween, and
      a third contact portion formed on the second implant region.

2. The device of claim 1, wherein:
   the third contact portion has a bottom portion in a first contact layer making ohmic contact with the second implant region and a top portion in a second contact layer formed directly on the first contact layer, the first contact layer having a height substantially the same as the height of a top surface of the gate electrode;
   the second contact portion is formed in the same second contact layer as the top portion of the third contact portion.

3. The device of claim 2, wherein the bottom portion is a slot contact.

4. The device of claim 2, further comprising a second dielectric layer on the first dielectric layer and on a portion of the gate electrode not covered by the first contact portion, wherein the first, second and third contact portions have a same height as the second dielectric layer.

5. The device of claim 1, wherein:
   the device is a decoupling capacitor in an integrated circuit (IC) having a functional circuit, the functional circuit having at one or more active devices including patterns in the same layer as the gate electrode of the device; and
   the second and third contact portions are dummy fill patterns unconnected to the functional circuit.

6. The device of claim 1, wherein the second contact portion, the first dielectric layer and the first implant region form a capacitor.

7. The device of claim 1, wherein the first contact portion and the second contact portion comprise different materials from each other.

8. An integrated circuit (IC), comprising:
   a semiconductor substrate having at least one circuit including a plurality of active devices, the active devices having a gate electrode layer; and
   a decoupling capacitor comprising:
      first and second implant regions of a first dopant type in the substrate;
      a gate insulating layer above a resistor region, the resistor region being a portion of the substrate between the first and second implant regions and a gate electrode formed in the gate electrode layer on the gate insulating layer;
      a first dielectric layer on the first implant region, the first dielectric layer having a top surface at a height substantially the same as a height of a top surface of the gate electrode; and
      a contact structure, including:
         a first contact portion conductively contacting the gate electrode, at least part of the first contact portion directly on the gate electrode,
         a second contact portion directly contacting the first contact portion and having an entire bottom surface thereof formed directly on dielectric material of the first dielectric layer, the bottom surface at substantially the same height as the top surface of the gate electrode, the second contact directly overlying the first implant region without a conductive connection therebetween, and
         a third contact portion formed on the second implant region.

9. The IC of claim 8, further comprising:
   a third implant region of the first dopant type in the substrate, the first, second and third implant regions aligned in the same row as each other;
   a second gate electrode above a second resistor region between the first and third implant regions, the first contact portion having an additional portion conductively contacting the second gate electrode,
   wherein the contact structure further comprises a fourth contact portion formed on the third implant region.

10. The IC of claim 8, further comprising:
    third and fourth implant regions of the first dopant type, the first and second implant regions aligned in a first row, the third and fourth implant regions aligned in a second row; and
    a second gate electrode above a second resistor region between the third and fourth implant regions,
    a fourth contact portion, at least part of the fourth contact portion formed directly on the second gate electrode, the fourth contact portion conductively contacting the second contact portion and an additional second contact portion formed above the third implant region,
    a portion of the first dielectric layer is formed between the third implant region and the additional second contact portion, and
    the third contact portion extends over and contacts the fourth implant region.

11. The IC of claim 10, further comprising:
    a fifth implant region of the first dopant type in the first row and a sixth implant region of the first dopant type in the second row;
    a third gate electrode above a third resistor region between the first and fifth implant regions,
    the first contact portion having an additional portion conductively contacting the third gate electrode, and
    a fifth contact portion formed on the fifth implant region and extending over the sixth implant region.

12. The IC of claim 8, further comprising:
    an interconnect structure having an intermetal dielectric layer and at least one conductive line layer having conductive patterns for connecting ones of the active devices, wherein:

the second and third contact portions are directly connected to ones of the conductive patterns of the conductive line layer, and the gate electrode is only connected to the conductive patterns indirectly by way of the first contact portion and the second contact portion.

13. The IC of claim 8, wherein one or more of the active devices of the circuit include patterns in the gate electrode layer, and the second and third contact portions are dummy fill patterns unconnected to the active devices of the circuit.

14. A method comprising:
(a) forming first and second implant regions of a first dopant type in a surface of a semiconductor substrate outside a functional device region that is to contain a plurality of active devices;
(b) providing a gate insulating layer and a gate electrode above a resistor region, the resistor region being a portion of the substrate between the first and second implant regions;
(c) providing a first dielectric layer on the first implant region, the first dielectric layer having a top surface at a height substantially the same as a height of a top surface of the gate electrode;
(d) forming a source contact on the second implant region;
(e) forming a gate contact conductively contacting the gate electrode, at least part of the gate contact portion directly on the gate electrode; and
(f) forming a capacitor contact having an entire bottom surface thereof formed directly on dielectric material of the first dielectric layer, the bottom surface at substantially the same height as the top surface of the gate electrode, the capacitor contact directly overlying the first implant region without a conductive connection therebetween, the capacitor contact directly contacting the gate contact.

15. The method of claim 14, wherein:
step (a) includes forming a third implant region of the first dopant type in the substrate, the first, second and third implant regions aligned in the same row as each other;
step (e) includes forming a second gate electrode above a second resistor region between the first and third implant regions, the gate contact having an additional portion conductively contacting the second gate electrode, and
step (d) further comprises forming a second source contact portion on the third implant region.

16. The method of claim 14, wherein:
step (a) includes forming third and fourth implant regions of the first dopant type, the first and second implant regions aligned in a first row, the third and fourth implant regions aligned in a second row, wherein the source electrode extends over fourth implant region.

17. The method of claim 16, wherein:
step (b) includes forming a second gate electrode above a second resistor region between the third and fourth implant regions, and
step (e) includes forming a second gate contact conductively contacting the second gate electrode, at least part of the second gate contact directly on the second gate electrode,
step (f) includes forming a second capacitor contact over the third implant region, the second capacitor contact and the second gate contact abutting each other;
the capacitor contact extends to directly contact the second gate contact; and
a portion of the first dielectric layer is formed between the third implant region and the second capacitor contact.

18. The method of claim 14, wherein step (d) includes:
forming a bottom source contact layer making ohmic contact with the second implant region, the bottom source contact layer having a thickness substantially the same as a thickness of the gate electrode;
and forming a top source contact layer on the bottom source contact layer.

19. The method of claim 18, wherein the top source contact layer and the capacitor contact are formed in the same layer, and step (f) is performed at the same time the top source contact layer is formed.

20. The method of claim 18, wherein
steps (e) and (f) are both performed after the bottom source contact layer is formed, and the gate contact and capacitor contact are formed of different materials from each other.

* * * * *